United States Patent [19]
Jang

[11] Patent Number: 6,165,897
[45] Date of Patent: Dec. 26, 2000

[54] VOID FORMING METHOD FOR FABRICATING LOW DIELECTRIC CONSTANT DIELECTRIC LAYER

[75] Inventor: Syun-Ming Jang, Hsin-Chu, Taiwan

[73] Assignee: Taiwan Semiconductor Manufacturing Company, Hsin-Chu, Taiwan

[21] Appl. No.: 09/086,823

[22] Filed: May 29, 1998

[51] Int. Cl.$^7$ ............................................. H01L 21/4763
[52] U.S. Cl. ..................... 438/637; 438/763; 438/778; 438/787
[58] Field of Search ................... 438/619, 637, 438/787, 778, 763

[56] References Cited

U.S. PATENT DOCUMENTS

| | | | |
|---|---|---|---|
| 5,310,700 | 5/1994 | Lien et al. | 437/195 |
| 5,407,860 | 4/1995 | Stoltz et al. | 437/180 |
| 5,510,645 | 4/1996 | Fitch et al. | 257/522 |
| 5,536,681 | 7/1996 | Jang et al. | 437/195 |
| 5,556,806 | 9/1996 | Pan et al. | 438/624 |
| 5,641,712 | 6/1997 | Grivna et al. | 438/624 |
| 5,728,631 | 3/1998 | Wang | 438/787 |
| 5,776,834 | 7/1998 | Avanzino et al. | 438/787 |
| 5,837,618 | 11/1998 | Avanzino et al. | 438/778 |
| 5,858,882 | 1/1999 | Chang et al. | 438/761 |
| 5,861,345 | 1/1999 | Chou et al. | 438/763 |
| 5,902,122 | 5/1999 | Sheen et al. | 438/224 |
| 6,004,873 | 12/1999 | Jang et al. | 438/787 |
| 6,093,637 | 7/2000 | Kishimoto et al. | 438/778 |

FOREIGN PATENT DOCUMENTS

| | | |
|---|---|---|
| 63-98134 | 4/1988 | Japan . |
| 2151032 | 6/1990 | Japan . |

Primary Examiner—Jey Tsai
Assistant Examiner—Lynnne A. Gurley
Attorney, Agent, or Firm—George O. Saile; Stephen B. Ackerman; Alek P. Szecsy

[57] ABSTRACT

A method for forming a dielectric layer within a microelectronics fabrication. There is first provided a microelectronics substrate layer employed within a microelectronics fabrication. There is then formed upon the microelectronics substrate layer a patterned microelectronics layer. There is then formed conformally over the patterned microelectronics layer a conformal silicon oxide dielectric layer formed employing a plasma enhanced chemical vapor deposition (PECVD) method employing silane as a silicon source material. The conformal silicon oxide dielectric layer comprises: (1) a first region formed over the upper surface of the patterned microelectronics layer; (2) a second region formed interposed between a series of patterns which comprises the patterned microelectronics layer and parallel with a series of sidewalls of the series of patterns which comprises the patterned microelectronics layer; and (3) a third region formed interposed between the series of patterns which comprises the patterned microelectronics layer but not parallel with the series of sidewalls of the series of patterns which comprises the patterned microelectronics layer. There is then treated with an oxygen containing plasma the conformal silicon oxide dielectric layer to enhance the rate of formation of a second silicon oxide dielectric layer upon the first region of the conformal silicon oxide dielectric layer with respect to at least the second region of the conformal silicon oxide dielectric layer. The second silicon oxide dielectric layer is formed employing an ozone assisted thermal chemical vapor deposition (CVD) method employing tetraethylorthosilicate (TEOS) as a silicon source material. Finally, there is then formed upon the oxygen containing plasma treated conformal silicon oxide dielectric layer the second silicon oxide dielectric layer, where the second silicon oxide dielectric layer defines, at least in part, a series of voids formed interposed between the series of patterns which comprises the patterned microelectronics layer.

7 Claims, 3 Drawing Sheets

VOID FORMING METHOD FOR FABRICATING LOW DIELECTRIC CONSTANT DIELECTRIC LAYER

BACKGROUND OF THE INVENTION

1. Field of the Invention

The present invention relates generally to methods for fabricating dielectric layers employed within microelectronics fabrications. More particularly, the present invention relates to methods for fabricating comparatively low dielectric constant dielectric layers employed within microelectronics fabrications.

2. Description of the Related Art

Microelectronics fabrications are formed from microelectronics substrates over which are formed patterned microelectronics conductor layers which are separated by microelectronics dielectric layers.

As microelectronics integration levels have increased and patterned microelectronics conductor layer linewidth dimensions have decreased, it has become more common within the art of microelectronics fabrication to employ low dielectric constant dielectric layers formed interposed between the patterns of patterned microelectronics conductor layers within microelectronics fabrications. Low dielectric constant dielectric layers are desirable interposed between the patterns of patterned microelectronics conductor layers within microelectronics fabrications since such low dielectric constant dielectric layers typically provide microelectronics fabrications with enhanced microelectronics fabrication speed, reduced microelectronics fabrication parasitic capacitance and attenuated patterned microelectronics conductor layer cross-talk.

Of the methods and materials which may be employed for forming low dielectric constant dielectric layers interposed between the patterns of patterned microelectronics conductor layers within microelectronics fabrications, methods which provide dielectric layers which in turn define vacuum evacuated or gas filled (such as but not limited to air filled) voids interposed between the patterns of patterned microelectronics conductor layers are particularly desirable within the art of microelectronics fabrication. Such methods are desirable since vacuum evacuated or gas filled voids typically yield within a microelectronics fabrication a dielectric layer possessing in the pertinent locations interposed between a series of patterns which comprises a patterned microelectronics conductor layer a dielectric constant approaching a theoretical lower limit of 1.0. For comparison purposes, conventional silicon containing dielectric layers formed of silicon containing dielectric materials such as but not limited to silicon oxide dielectric materials, silicon nitride dielectric materials and silicon oxynitride dielectric materials typically exhibit homogeneous dielectric constants within a range of from about 4.0 to about 4.4. Similarly, alternative low dielectric constant dielectric layers formed from low dielectric constant dielectric materials such as but not limited to organic polymer spin-on-polymer dielectric materials (such as but not limited to polyimide organic polymer spin-on-polymer dielectric materials, poly (arylene ether) organic polymer spin-on-polymer dielectric materials and fluorinated poly (arylene ether) organic polymer spin-on-polymer dielectric materials), amorphous carbon dielectric materials and silsesquioxane spin-on-glass (SOG) dielectric materials (such as but not limited to hydrogen silsesquioxane spin-on-glass (SOG) dielectric materials, carbon bonded hydrocarbon silsesquioxane spin-on-glass (SOG) dielectric materials and carbon bonded fluorocarbon silsesquioxane spin-on-glass (SOG) dielectric materials) typically exhibit somewhat lower homogeneous dielectric constants in a range of from about 2.5 to about 3.3.

It is therefore towards the goal of forming within microelectronics fabrications low dielectric constant dielectric layers which define, at least in part, vacuum evacuated or gas filled voids interposed between the patterns of patterned conductor layers upon which are formed those low dielectric constant dielectric layers, that the present invention is more generally directed.

Various methods and associated microelectronics structures have been disclosed within the art of microelectronics fabrication for forming upon patterned microelectronics conductor layers within microelectronics fabrications microelectronics dielectric layers which at least in part define vacuum evacuated or gas filled voids interposed between the patterns which comprise patterned conductor layers within microelectronics fabrications.

For example, Machida, in Japan Patent No. 63-98134(A), discloses an integrated circuit microelectronics fabrication having formed therein upon a patterned conductor layer a low dielectric constant dielectric layer in turn having formed therein a series of voids interposed between the patterns which comprise the patterned conductor layer. Within the integrated circuit microelectronics fabrication so formed, a capacitance of the patterns which comprise the patterned conductor layer is reduced even under circumstances where a thickness of a second dielectric layer upon which is formed the patterned conductor layer is equal to a separation distance of the patterns which comprise the patterned conductor layer.

In addition, and analogously with Machida, Koyama, in Japan Patent No. 2-151032(A), discloses an integrated circuit microelectronics fabrication also having formed therein upon a patterned conductor layer a low dielectric constant dielectric layer which defines a series of voids interposed between a series of patterns which comprises the patterned conductor layer. The voids are sealed within the low dielectric constant dielectric layer in a fashion such that an encapsulating resin subsequently formed upon the low dielectric constant dielectric layer is substantially precluded from permeating into the voids.

Further, Lien et al., in U.S. Pat. No. 5,310,700, discloses another analogous method for forming within an integrated circuit microelectronics fabrication a low dielectric constant dielectric layer over a patterned conductor layer, where the low dielectric constant dielectric layer defines a series of voids formed interposed between a series of patterns which comprises the patterned conductor layer. The method may employ a patterned hard mask layer formed upon, and wider than, the patterned conductor layer, in order to more readily form the series of voids when forming the low dielectric constant dielectric layer.

Still further, Stoltz et al., in U.S. Pat. No. 5,407,860, discloses a method for defining a series of voids interposed between a series of patterns which comprises a patterned conductor layer within an integrated circuit microelectronics fabrication when forming upon the patterned conductor layer within the integrated circuit microelectronics fabrication a dielectric layer. The method employs a non-wetting material formed upon at least the sidewalls of the series of patterns which comprises the patterned conductor layer but not completely occupying the spaces between the series of patterns which comprises the patterned conductor layer nor upon the top surfaces of the series of patterns which comprises the patterned conductor layer. Thus, when a dielectric layer is subsequently formed upon the patterned conductor layer having the non-wetting material selectively formed upon portions of its patterns there is formed a series of voids beneath the dielectric layer, where the series of voids is formed interposed between the series of patterns which comprises the patterned conductor layer.

Still yet further, Fitch et al., in U.S. Pat. No. 5,510,645, discloses several additional methods, and structures formed therefrom, for defining a series of voids interposed between a series of patterns which comprises a patterned conductor layer within an integrated circuit microelectronics fabrication when forming upon the patterned conductor layer within the integrated circuit microelectronics fabrication a dielectric layer. The methods employ selective etching to remove sacrificial layers formed interposed between the series of patterns which comprises the patterned conductor layer, thus forming voids in locations previously occupied by the sacrificial layers.

Finally, although related more specifically to attenuating void formation within dielectric layers formed interposed between the patterns which comprise patterned conductor layers within integrated circuit microelectronics fabrications rather than promoting void formation within dielectric layers formed interposed between the patterns which comprise patterned conductor layers within integrated circuit microelectronics fabrications, Jang et al., in U.S. Pat. No. 5,536,681, also discloses a method pertinent to the present invention. The method employs a selective nitrogen plasma treatment of upper lying portions of a conformal silicon oxide liner layer formed upon a patterned conductor layer within an integrated circuit microelectronics fabrication, such that there is attenuated formation of voids interposed between the patterns which comprise the patterned conductor layer when there is subsequently formed upon the selectively nitrogen plasma treated conformal silicon oxide liner layer a gap filling dielectric layer formed employing an ozone assisted thermal chemical vapor deposition (CVD) method employing tetraethylorthosilicate (TEOS) as a silicon source material.

Desirable in the art of microelectronics fabrication are additional methods and materials which may be employed for forming a dielectric layer over a patterned microelectronics layer within a microelectronics fabrications, such that a series of vacuum evacuated or gas filled voids is defined interposed between a series of patterns which comprises the patterned microelectronics layer when forming the dielectric layer over the patterned microelectronics layer. More particularly desirable in the art of integrated circuit microelectronics fabrication are additional methods and materials which may be employed for forming a dielectric layer over a patterned conductor layer within an integrated circuit microelectronics fabrication, such that a series of vacuum evacuated or gas filled voids is formed interposed between a series of patterns which comprises the patterned conductor layer when forming the dielectric layer over the patterned conductor layer.

It is towards the foregoing goals that the present invention is both generally and more specifically directed.

SUMMARY OF THE INVENTION

A first object of the present invention is to provide a method for forming a dielectric layer over a patterned microelectronics layer within a microelectronics fabrication.

A second object of the present invention is to provide a method in accord with the first object of the present invention, where a series of voids is defined interposed between a series of patterns which comprises the patterned microelectronics layer when forming the dielectric layer over the patterned microelectronics layer.

A third object of the present invention is to provide a method in accord with the first object of the present invention or the second object of the present invention, where the microelectronics fabrication is an integrated circuit microelectronics fabrication and the patterned layer is a patterned conductor layer formed within the integrated circuit microelectronics fabrication.

A fourth object of the present invention is to provide a method in accord with the first object of the present invention, the second object of the present invention or the third object of the present invention, which method is readily commercially implemented.

In accord with the objects of the present invention, there is provided by the present invention a method for forming a dielectric layer within a microelectronics fabrication. To practice the method of the present invention, there is first provided a microelectronics substrate layer employed within a microelectronics fabrication. There is then formed upon the microelectronics substrate layer a patterned microelectronics layer. There is then formed conformally over the patterned microelectronics layer a conformal silicon oxide dielectric layer formed employing a plasma enhanced chemical vapor deposition (PECVD) method employing silane as a silicon source material. The conformal silicon oxide dielectric layer comprises: (1) a first region of the conformal silicon oxide dielectric layer formed over the upper surfaces of the patterned microelectronics layer; (2) a second region of the conformal silicon oxide dielectric layer formed interposed between a series of patterns which comprises the patterned microelectronics layer and parallel with a series of sidewalls of the series of patterns which comprises the patterned microelectronics layer; and (3) a third region of the conformal silicon oxide dielectric layer formed interposed between the series of patterns which comprises the patterned microelectronics layer but not parallel with the series of sidewalls of the series of patterns which comprises the patterned microelectronics layer. There is then treated with an oxygen containing plasma the conformal silicon oxide dielectric layer to form an oxygen containing plasma treated conformal silicon oxide dielectric layer. The oxygen containing plasma treated conformal silicon oxide dielectric layer has an enhanced rate of formation of a second silicon oxide dielectric layer upon the first region of the oxygen containing plasma treated conformal silicon oxide dielectric layer with respect to at least the second region of the oxygen containing plasma treated conformal silicon oxide dielectric layer. The second silicon oxide dielectric layer is formed employing an ozone assisted thermal chemical vapor deposition (CVD) method employing tetraethylorthosilicate (TEOS) as a silicon source material. Finally, there is then formed upon the oxygen containing plasma treated conformal silicon oxide dielectric layer the second silicon oxide dielectric layer. The second silicon oxide dielectric layer defines, at least in part, a series of voids formed interposed between the series of patterns which comprises the patterned microelectronics layer.

The present invention provides a method for forming a dielectric layer over a patterned microelectronics layer within a microelectronics fabrication, where a series of voids is formed interposed between a series of patterns which comprises the patterned microelectronics layer when forming the dielectric layer over the patterned microelectronics layer. The method of the present realizes this object by treating with an oxygen containing plasma a conformal silicon oxide dielectric layer formed over the patterned microelectronics layer such that there is enhanced for a first region of the oxygen containing plasma treated conformal silicon oxide dielectric layer formed over the upper surfaces of the patterned microelectronics layer with respect to at least a second region of the oxygen containing plasma treated conformal silicon oxide dielectric layer formed interposed between the patterns which comprise the patterned microelectronics layer and parallel with a series of sidewalls of the patterns which comprise the patterned microelectronics layer a rate of formation of a second silicon oxide dielectric layer upon the oxygen containing plasma treated conformal silicon oxide dielectric layer. Thus, when the second silicon oxide dielectric layer is formed upon the oxygen containing plasma treated conformal silicon oxide dielectric layer, there is formed a series of voids interposed between the patterns which comprise the patterned conductor layer.

The present invention may be employed where the microelectronics fabrication is an integrated circuit microelectronics fabrication and where the patterned layer is a patterned conductor layer formed within the integrated circuit microelectronics fabrication. The method of the present invention does not discriminate with respect to the nature of a microelectronics fabrication within which there may be formed a series of voids interposed between a series of patterns which comprises a patterned microelectronics layer in accord with the method of the present invention. Thus, although the method of the present invention is most likely to provide value when forming a series of voids interposed between a series of patterns which comprises a patterned conductor layer within an integrated circuit microelectronics fabrication, the method of the present invention may also be employed when forming a series of voids interposed between a series of patterns which comprises a patterned microelectronics layer selected from the group including but not limited to patterned microelectronics conductor layers, patterned microelectronics semiconductor layers and patterned microelectronics dielectric layers, within microelectronics fabrications including but not limited to integrated circuit microelectronics fabrications, solar cell microelectronics fabrications, ceramic substrate microelectronics fabrications and flat panel display microelectronics fabrications.

The method of the present invention is readily commercially implemented. The method of the present invention employs an oxygen containing plasma treatment of a conformal silicon oxide dielectric layer formed over a patterned microelectronics layer within a microelectronics fabrication to provide regioselective deposition rates of a second silicon oxide dielectric layer upon the conformal silicon oxide dielectric layer. Since methods employed for forming the conformal silicon oxide dielectric layer and the second silicon oxide dielectric layer employed within the method of the present invention are generally known within the art of microelectronics fabrication, and oxygen containing plasma treatment methods are similarly also generally known in the art of microelectronics fabrication, the method of the present invention is readily commercially implemented.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

The present invention provides a method for forming a dielectric layer over a patterned microelectronics layer within a microelectronics fabrication, where a series of voids is formed interposed between a series of patterns which comprises the patterned microelectronics layer when forming the dielectric layer over the patterned microelectronics layer. The method of the present realizes this object by treating with an oxygen containing plasma a conformal silicon oxide dielectric layer formed over the patterned microelectronics layer such that there is enhanced for a first region of the oxygen containing plasma treated conformal silicon oxide dielectric layer formed over the upper surfaces of the patterned microelectronics layer with respect to at least a second region of the oxygen containing plasma treated conformal silicon oxide dielectric layer formed interposed between the patterns which comprise the patterned microelectronics layer and parallel with a series of sidewalls of the patterns which comprise the patterned microelectronics layer a rate of formation of a second silicon oxide dielectric layer upon the oxygen containing plasma treated conformal silicon oxide dielectric layer. Thus, when the second silicon oxide dielectric layer is formed upon the oxygen containing plasma treated conformal silicon oxide dielectric layer, there is formed a series of voids defined at least in part by the second silicon oxide dielectric layer, where the series of voids is formed interposed between the patterns which comprise the patterned conductor layer.

Although the method of the present invention is most likely to provide value when forming a series of voids interposed between a series of patterns which comprises a patterned conductor layer within an integrated circuit microelectronics fabrication, the method of the present invention may also be employed when forming a series of voids interposed between a series of patterns which comprises a patterned microelectronics layer selected from the group including but not limited to patterned microelectronics conductor layers, patterned microelectronics semiconductor layers and patterned microelectronics dielectric layers within microelectronics fabrications including but not limited to integrated circuit microelectronics fabrications, solar cell microelectronics fabrications, ceramic substrate microelectronics fabrications and flat panel display microelectronics fabrications.

First Preferred Embodiment

Figure 1:
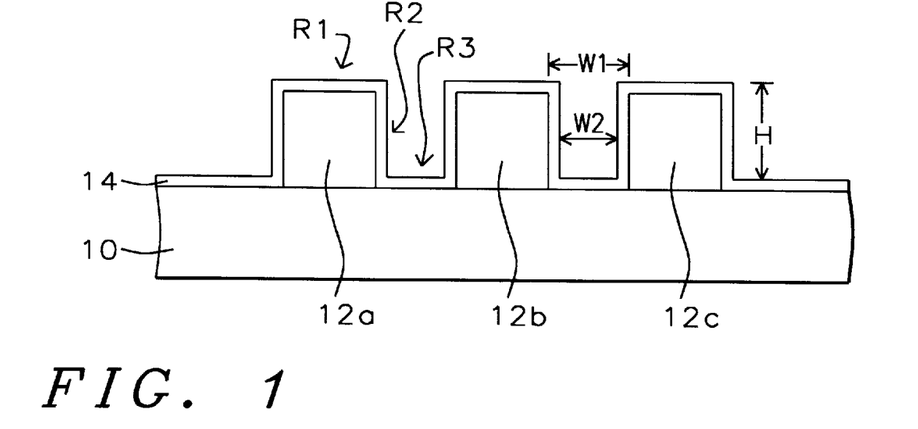
FIG. 1 to FIG. 3 shown a series of schematic cross-sectional diagrams illustrating the results of forming within a microelectronics fabrication in accord with a general embodiment of the present invention which comprises a first preferred embodiment of the present invention a dielectric layer over a patterned microelectronics layer within the microelectronics fabrication to define a series of voids interposed between a series of patterns which comprises the patterned microelectronics layer.
Figure 2:
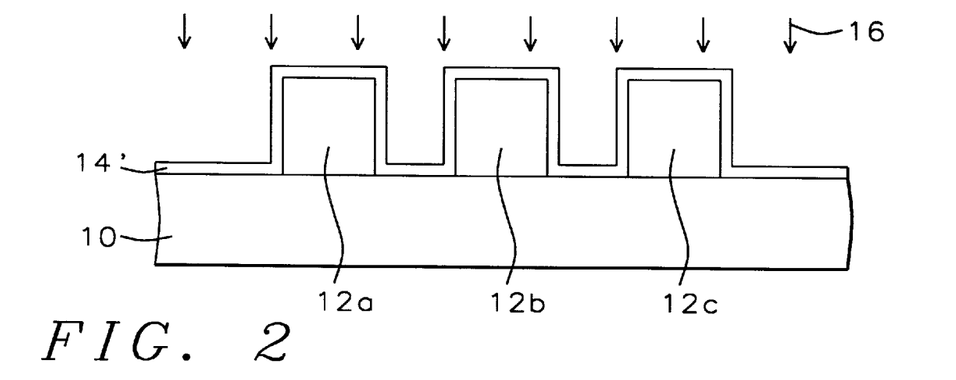
Figure 3:
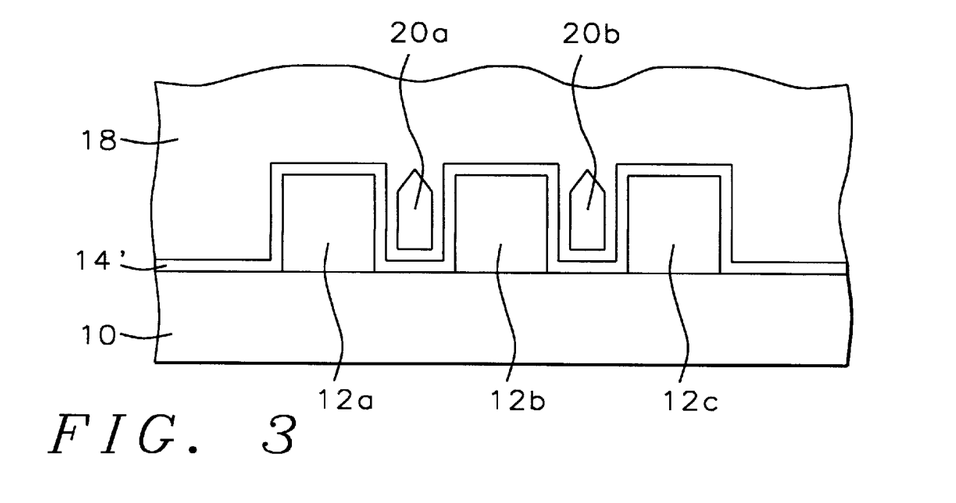

Referring now to FIG. 1 to FIG. 3, there is shown a series of schematic cross-sectional diagrams illustrating the results of forming within a microelectronics fabrication in accord with a general embodiment of the present invention which comprises a first preferred embodiment of the present invention a dielectric layer over a patterned microelectronics layer within the microelectronics fabrication to define a series of voids interposed between a series of patterns which comprises the patterned microelectronics layer. Shown in FIG. 1 is a schematic cross-sectional diagram of the microelectronics fabrication at an early stage in its fabrication in accord with the first preferred embodiment of the present invention.

Shown in FIG. 1 is a substrate 10 employed within a microelectronics fabrication, where the substrate has formed thereupon a series of patterned microelectronics layers 12a, 12b and 12c. Similarly, there is also shown within FIG. 1 a blanket conformal silicon oxide dielectric layer 14 formed upon the series of patterned microelectronics layers 12a, 12b and 12c, and portions of the substrate 10 exposed adjoining the series of patterned microelectronics layers 12a, 12b and 12c.

Within the first preferred embodiment of the present invention, the substrate 10 may be a substrate employed within a microelectronics fabrication selected from the group including but not limited to integrated circuit microelectronics fabrications, solar cell microelectronics fabrications, ceramic substrate microelectronics fabrications and flat panel display microelectronics fabrications. Although not specifically illustrated within the schematic cross-sectional diagram of FIG. 1, the substrate 10 may be the substrate itself employed within the microelectronics fabrication. Or in the alternative, the substrate 10 may be the substrate employed within the microelectronics fabrication, where the substrate has any of several additional microelectronics substrate layers formed thereupon or thereover. Such additional microelectronics substrate layers (similarly with the substrate 10 itself) may include, but are not limited to microelectronics conductor substrate layers, microelectronics semiconductor substrate layers and microelectronics dielectric substrate layers.

With respect to the patterned microelectronics layers 12a, 12b and 12c, the patterned microelectronics layers 12a, 12b and 12c may be formed from any of several types of microelectronics materials as are known in the art of microelectronics fabrication, including but not limited to microelectronics conductor materials, microelectronics semiconductor materials and microelectronics dielectric materials. Although not specifically illustrated within the schematic cross-sectional diagram of FIG. 1, the patterned microelectronics layers 12a, 12b and 12c each have a thickness upon the substrate 10 of from about 3000 to about 10000 angstroms and a linewidth upon the substrate 10 of from about 0.2 to about 0.5 microns. As is specifically illustrated within the schematic cross-sectional diagram of FIG. 1, each patterned microelectronics layer 12a, 12b or 12c is separated from an adjoining patterned microelectronics layer 12a, 12b or 12c by a pitch width W1 of from about 0.2 to about 1.2 microns over the substrate 10.

Finally, with respect to the conformal silicon oxide dielectric layer 14, within the first preferred embodiment of the present invention the conformal silicon oxide dielectric layer 14 is formed of a silicon oxide dielectric material formed employing a plasma enhanced chemical vapor deposition (PECVD) method employing silane as a silicon source material. Preferably, the plasma enhanced chemical vapor deposition (PECVD) method also employs: (1) a reactor chamber pressure of from about 2 to about 5 torr; (2) a radio frequency power of from about 100 to about 200 watts at a radio frequency of 13.56 MHZ; (3) a substrate 10 temperature of from about 360 to about 440 degrees centigrade; (4) a silane flow rate of from about 40 to about 100 standard cubic centimeters per minute (sccm); (5) a nitrous oxide oxidant at a flow rate of from about 900 to about 1500 standard cubic centimeters per minute (sccm); and (6) a spacing between a showerhead nozzle and the substrate 10 of from about 300 to about 400 mils. Preferably, the conformal silicon oxide dielectric layer 14 so formed is formed to a thickness of from about 500 to about 1000 angstroms while providing a gap of gap width W2 from about 0.1 to about 1.0 microns and gap height H of from about 3000 to about 10000 angstroms interposed between adjoining pairs of patterned microelectronics layers within the series of patterned microelectronics layers 12a, 12b and 12c.

As is illustrated within the schematic cross-sectional diagram of FIG. 1, the conformal silicon oxide dielectric layer 14 (as well as an oxygen containing plasma treated conformal silicon oxide dielectric layer formed employing a subsequent oxygen containing plasma treatment of the conformal silicon oxide dielectric layer 14) comprises three regions, including: (1) a first region R1 formed over the upper surfaces of the patterned microelectronics layers 12a, 12b and 12c; (2) a second region R2 formed interposed between the patterned microelectronics layers 12a, 12b and 12c and parallel with a series of sidewalls of the series of the patterned microelectronics layers 12a, 12b and 12c; and (3) a third region R3 formed interposed between the series of patterned microelectronics layers 12a, 12b and 12c but not parallel with the series of sidewalls of the series of patterned microelectronics layer 12a, 12b and 12c.

Referring now to FIG. 2, there is shown a schematic cross-sectional diagram illustrating the results of further processing of the microelectronics fabrication whose schematic cross-sectional diagram is illustrated in FIG. 1. Shown in FIG. 2 is a schematic cross-sectional diagram of a microelectronics fabrication otherwise equivalent to the microelectronics fabrication whose schematic cross-sectional diagram is illustrated in FIG. 1, but wherein the conformal silicon oxide dielectric layer 14 is treated with an oxygen containing plasma 16 to form therefrom an oxygen containing plasma treated conformal silicon oxide dielectric layer 14'.

Within the first preferred embodiment of the present invention, the oxygen containing plasma treated silicon oxide dielectric layer 14' has an enhanced rate of formation of a second silicon oxide dielectric layer upon the first region R1 of the oxygen containing plasma treated conformal silicon oxide dielectric layer 14' with respect to at least the second region R2 of the oxygen containing plasma treated conformal silicon oxide dielectric layer 14'. Within the first preferred embodiment of the present invention, the second silicon oxide dielectric layer is formed employing an ozone assisted thermal chemical vapor deposition (CVD) method employing tetraethylorthosilicate (TEOS) as a silicon source material.

Within the first preferred embodiment of the present invention, the oxygen containing plasma 16 employed when treating the conformal silicon oxide dielectric layer 14 when forming the oxygen containing plasma treated silicon oxide dielectric layer 14' preferably employs an oxygen containing plasma gas selected from the group including but not limited to oxygen, ozone, nitrous oxide and nitric oxide. More preferably, the oxygen containing plasma gas is oxygen. Preferably, the oxygen containing plasma treatment method which employs the oxygen containing plasma 16 also employs: (1) a reactor chamber pressure of from about 1 to about 5 torr; (2) a first radio frequency power of from about 50 to about 150 watts at a first radio frequency of 13.56 MHZ along with a simultaneous second radio frequency power of from about 400 to about 500 watts at a second radio frequency power of 350 kHz; (3) a substrate 10 temperature of from about 360 to about 440 degrees centigrade; (4) an oxygen flow rate of from about 300 to about 800 standard cubic centimeters per minute (sccm); and (5) a plasma electrode to substrate 10 spacing of from about 400 to about 600 mils.

Referring now to FIG. 3, there is shown a schematic cross-sectional diagram illustrating the results of further processing of the microelectronics fabrication whose schematic cross-sectional diagram is illustrated in FIG. 2. Shown in FIG. 3 is a schematic cross-sectional diagram of a microelectronics fabrication otherwise equivalent to the microelectronics fabrication whose schematic cross-sectional diagram is illustrated in FIG. 2, but wherein there is formed upon the oxygen containing plasma treated conformal silicon oxide dielectric layer 14' the second silicon oxide dielectric layer 18 formed employing the ozone assisted thermal chemical vapor deposition (CVD) method employing tetraethylorthosilicate (TEOS) as a silicon source material. Preferably, the ozone assisted thermal chemical vapor deposition (CVD) method employs: (1) a reactor chamber pressure of from about 400 to about 600 torr (which typically inherently precludes plasma activation); (2) a substrate 10 temperature of from about 360 to about 440 degrees centigrade; (3) an ozone concentration of from about 8 to about 14 weight percent in an oxygen carrier gas flow of from about 4000 to about 6000 standard cubic centimeters per minute (sccm); (4) a tetraethylorthosilicate (TEOS) concentration of from about 400 to about 550 milligrams per cubic meter in a helium carrier gas flow of from about 2000 to about 3000 standard cubic centimeters per minute (sccm); and (5) a showerhead nozzle to substrate 10 spacing of from about 300 to about 400 mils. Preferably, the second silicon oxide dielectric layer 18 is formed to a thickness of from about 4000 to about 7000 angstroms.

When employing within the first preferred embodiment of the present invention, the foregoing conditions with respect to forming the oxygen containing plasma 16 and the second silicon oxide dielectric layer 18, a rate of formation of the second silicon oxide dielectric layer 18 upon the first region of the R1 of the oxygen containing plasma treated conformal silicon oxide dielectric layer 14' is typically from about 700 to about 1200 angstroms per minute, while a rate of formation of the second silicon oxide dielectric layer 18 upon the second region R2 of the oxygen containing plasma treated conformal silicon oxide dielectric layer 14' is typically from about 75 to about 200 angstroms per minute. Typically, a rate of formation of the second silicon oxide dielectric layer 18 upon the third region R3 of the oxygen containing plasma treated conformal silicon oxide dielectric layer 14' is also generally reduced and in a range of from about 150 to about 400 angstroms per minute.

Finally, there is shown in FIG. 3 a pair of voids 20a and 20b formed interposed between the patterned microelectronics layers 12a, 12b and 12c, where the pair of voids 20a and 20b is defined at least in part by the second silicon oxide dielectric layer 18. The size and positioning of the pair of voids 20a and 20b formed interposed between the patterned microelectronics layers 12a, 12b and 12c relates to the gap height H and the gap width W2 separating adjoining patterned microelectronics layers 12a, 12b and 12c, as illustrated within the schematic cross-sectional diagram of FIG. 1, in conjunction with the values of parameters employed when forming the oxygen containing plasma 16 as illustrated in FIG. 2 and the second silicon oxide dielectric layer 18 as illustrated within FIG. 3. Typically, since silicon oxide dielectric layers formed employing ozone assisted thermal chemical vapor deposition (CVD) methods employing tetraethylorthosilicate (TEOS) as a silicon source material are formed with flow like properties, voids, such as the pair of voids 20a and 20b, will typically not extend above the upper surfaces of the patterned microelectronics layers interposed between which the voids are formed. Under conditions where the gap width W2 is particularly narrow (for example, within the range of from about 0.1 to about 0.35 microns) and the gap height H is particularly tall (for example, in the range of from about 0.5 to about 1.0 microns), there is typically observed minimal, if any, formation of the second silicon oxide dielectric layer 18 upon the sidewalls of the conformal silicon oxide dielectric layer 14 interposed between the patterned microelectronics layers 12a, 12b and 12c. Under such circumstances, the pair of voids 20a and 20b is defined by both the oxygen containing plasma treated silicon oxide dielectric layer 14' and the second silicon oxide dielectric layer 18.

In contrast, and consistent with the microelectronics fabrication whose schematic cross-sectional diagram is illustrated in FIG. 3, under conditions where the gap width W2 is somewhat wider (for example, within the range of from about 0.35 to about 0.5 microns) and the gap height is less tall (for example, in the range of from about 0.3 to about 0.5 microns), portions of the second silicon oxide dielectric layer 18 form upon both the second region R2 and the third region R3 of the oxygen containing plasma treated silicon oxide dielectric layer 14'. Under such circumstances, the pair of voids 20a and 20b is defined solely within the second silicon oxide dielectric layer 18.

Upon forming the microelectronics fabrication whose schematic cross-sectional diagram is illustrated within FIG. 3, there is formed a microelectronics fabrication having formed therein a series of voids interposed between a series of patterns which comprises a patterned microelectronics layer, when forming over the patterned microelectronics layer a dielectric layer.

Second Preferred Embodiment

Figure 4:
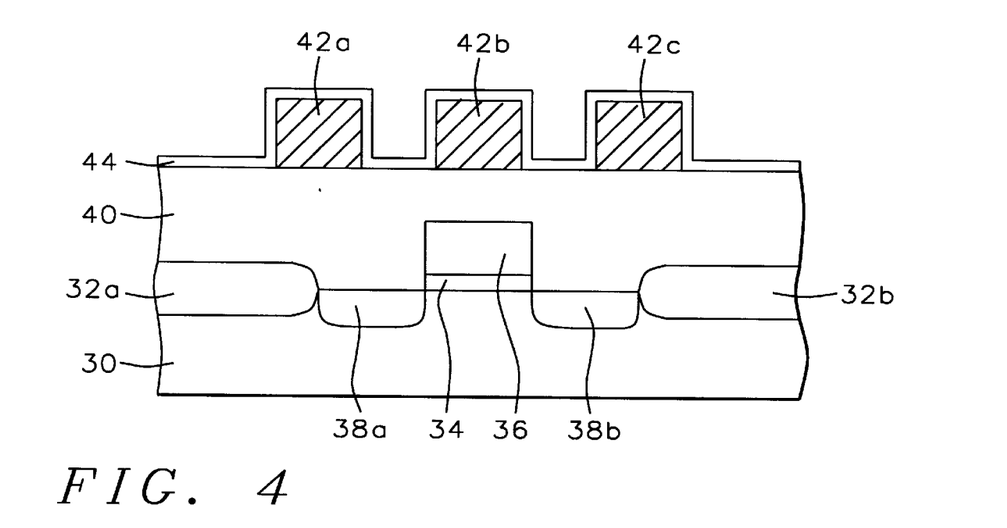
FIG. 4 to FIG. 6 shown a series of schematic cross-sectional diagrams illustrating the results of forming within an integrated circuit microelectronics fabrication in accord with a more specific embodiment of the present invention which comprises a second preferred embodiment of the present invention a dielectric layer over a patterned conductor layer within the integrated circuit microelectronics fabrication to form a series of voids interposed between a series of patterns which comprises the patterned conductor layer.
Figure 5:
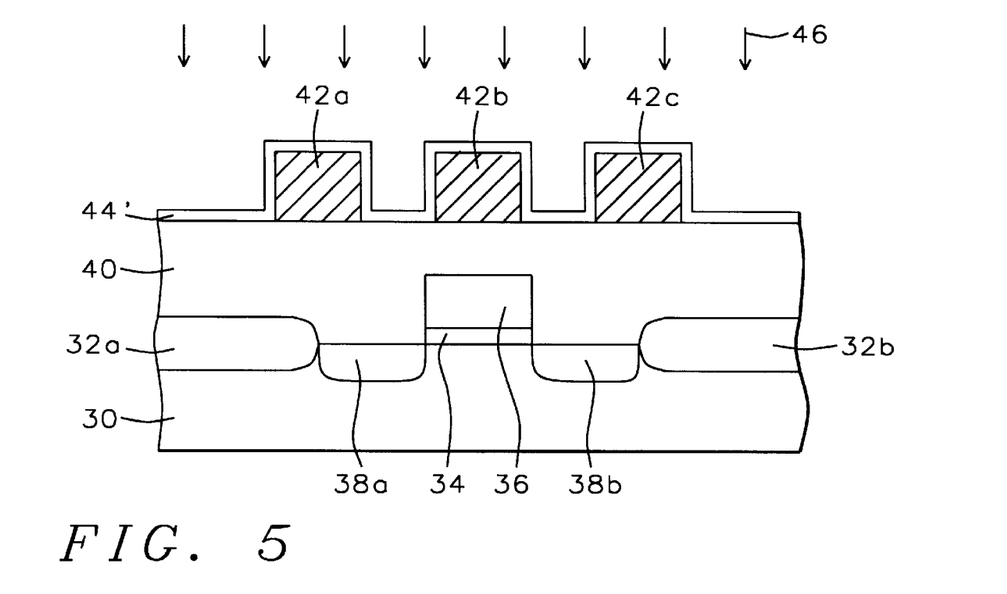
Figure 6:
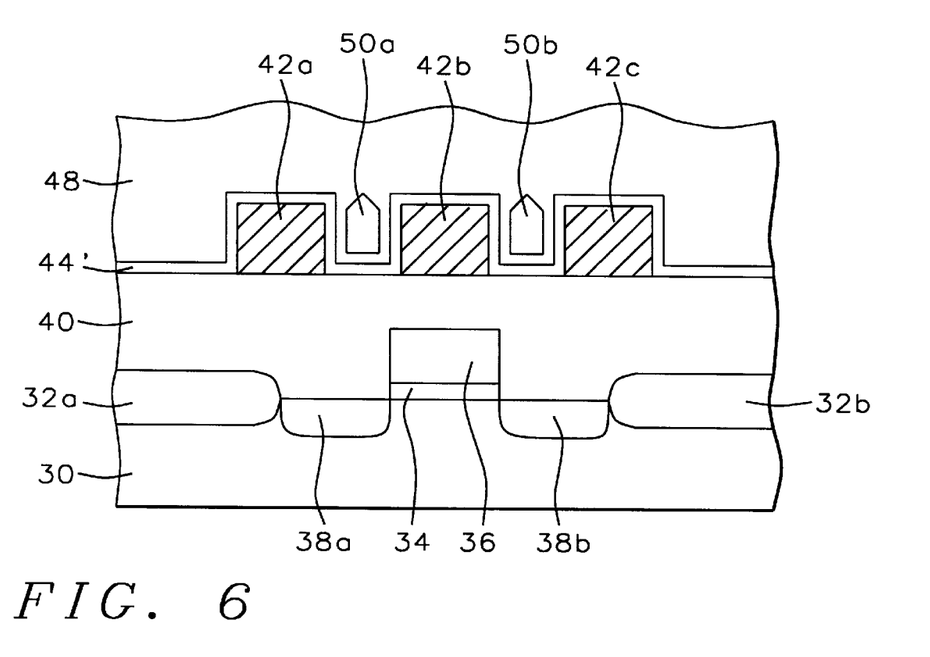

Referring now to FIG. 4 to FIG. 6, there is shown a series of schematic cross-sectional diagrams illustrating the results of forming within an integrated circuit microelectronics fabrication in accord with a more specific embodiment of the present invention which comprises a second preferred embodiment of the present invention a dielectric layer over a patterned conductor layer within the integrated circuit microelectronics fabrication to define a series of voids interposed between a series of patterns which comprises the patterned conductor layer.

Shown in FIG. 4 is a schematic cross-sectional diagram of the integrated circuit microelectronics fabrication at an early stage in its fabrication in accord with the method of the present invention. Shown in FIG. 4 is a semiconductor substrate 30 having formed within and upon its surface a pair of isolation regions 32a and 32b which define an active region of the semiconductor substrate 30. Although it is known in the art of integrated circuit microelectronics fabrication that semiconductor substrates are available with either dopant polarity, various dopant concentrations and several crystallographic orientations, for the second preferred embodiment of the present invention the semiconductor substrate 30 is preferably a (100) silicon semiconductor substrate having an N- or P- doping.

Similarly, although it is also known in the art of integrated circuit microelectronics fabrication that isolation regions may be formed within and/or upon semiconductor substrates to define active regions of those semiconductor substrates employing methods including but not limited to isolation region thermal growth methods and isolation region deposition/patterning methods, for the second preferred embodiment of the present invention the isolation regions 32a and 32b are preferably formed within and upon the semiconductor substrate 30 to define the active region of the semiconductor substrate 30 employing an isolation region thermal growth method at a temperature of from about 800 to about 1200 degrees centigrade to form the isolation regions 32a and 32b of silicon oxide within and upon the semiconductor substrate 30.

Shown also within FIG. 4 formed within and upon the active region of the semiconductor substrate 30 is a field effect transistor (FET) which comprise a series of structures including: (1) a gate dielectric layer 34 formed upon the active region of the semiconductor substrate 30, the gate dielectric layer 34 having formed and aligned thereupon; (2) a gate electrode 36; and (3) a pair of source/drain regions 38a and 38b formed within the active region of the semiconductor substrate 30 at areas not covered by the gate dielectric layer 34 and the gate electrode 36. Each of the structures within the series of structures which comprises the field effect transistor (FET) may be formed employing methods and materials which are conventional in the art of field effect transistor (FET) fabrication.

For example, although it is known in the art of field effect transistor (FET) fabrication that gate dielectric layers may be formed through patterning, employing methods as are conventional in the art, of blanket gate dielectric layers formed upon active regions of semiconductor substrates employing methods including but not limited to blanket gate dielectric layer thermal growth methods and blanket gate dielectric layer deposition/patterning methods, for the second preferred embodiment of the present invention the gate dielectric layer 34 is preferably formed through patterning, employing methods as are conventional in the art, of a blanket gate dielectric layer formed employing a blanket gate dielectric layer thermal growth method at a temperature of from about 700 to about 1000 degrees centigrade to form the gate dielectric layer 34 of silicon oxide of thickness about 30 to about 100 angstroms upon the active region of the semiconductor substrate 30.

Similarly, although it is also know in the art of field effect transistor (FET) fabrication that gate electrodes may be formed through patterning, employing methods as are conventional in the art, of blanket gate electrode material layers formed of gate electrode materials including but not limited to metals, metal alloys, doped polysilicon or polycides (doped polysilicon/metal silicide stacks), for the second preferred embodiment of the present invention the gate electrode 36 is preferably formed through patterning, employing methods as are conventional in the art, of a blanket layer of a doped polysilicon or a polycide gate electrode material formed upon the blanket gate dielectric layer to a thickness of from about 1000 to about 3000 angstroms.

Finally, it is also known in the art of field effect transistor (FET) fabrication that source/drain regions are typically formed into active regions of a semiconductor substrate employing ion implantation methods which employ dopant ions of polarity opposite the polarity of the semiconductor substrate within which is formed those source/drain regions. For the second preferred embodiment of the present invention, the source/drain regions 38a and 38b are preferably formed within the active region of the semiconductor substrate 30 employing a high dose ion implant at an ion implant dose of from about 1E15 to about 5E16 dopant ions per square centimeter and at an ion implantation energy of from about 10 to about 100 keV while employing at least the gate electrode 36 and the gate dielectric layer 34 as an ion implantation mask. The high dose ion implant is of polarity appropriate to the field effect transistor (FET) and the semiconductor substrate 30.

There is also shown within FIG. 4 formed over the semiconductor substrate 30 and the series of structures which forms the field effect transistor (FET) a planarized pre-metal dielectric (PMD) layer 40. Methods and materials through which planarized pre-metal dielectric (PMD) layers may be formed within integrated circuit microelectronics fabrications are known in the art of integrated circuit microelectronics fabrication. Planarized pre-metal dielectric (PMD) layers may be formed within integrated circuit microelectronics fabrications employing methods including but not limited to chemical vapor deposition (CVD) methods, plasma enhanced chemical vapor deposition (PECVD) methods and physical vapor deposition (PVD) sputtering methods, along with reactive ion etch (RIE) etchback planarizing methods and chemical mechanical polish (CMP) planarizing methods, through which may be formed planarized pre-metal dielectric (PMD) layers of dielectric materials including but not limited to silicon oxide dielectric materials, silicon nitride dielectric materials and silicon oxynitride dielectric materials. For the second preferred embodiment of the present invention, the planarized pre-metal dielectric (PMD) layer 40 is preferably formed of a silicon oxide dielectric material deposited employing a plasma enhanced chemical vapor deposition (PECVD) method and subsequently planarized employing a chemical mechanical polish (CMP) planarizing method, as is common in the art of integrated circuit microelectronics fabrication. Other methods and materials may, however, also be employed in forming the planarized pre-metal dielectric (PMD) layer 40. Preferably, the planarized pre-metal dielectric (PMD) layer 40 so formed is formed to a thickness of from about 5000 to about 15000 angstroms over the semiconductor substrate 30 and the series of structures which forms the field effect transistor (FET).

There is also shown in FIG. 4 a series of patterned first conductor layers 42a, 42b and 42c formed upon the blanket planarized pre-metal dielectric (PMD) layer 40. Methods and materials through which patterned conductor layers may be formed within integrated circuit microelectronics fabrications are known in the art of integrated circuit microelectronics fabrication. Patterned conductor layers are typically formed within integrated circuit microelectronics fabrications employing methods including but not limited to thermally assisted evaporation methods, electron beam assisted evaporation methods, chemical vapor deposition (CVD) methods and physical vapor deposition (PVD) sputtering methods, in conjunction with photolithographic and etching methods, through which may be formed patterned conductor layers of conductor materials including but not limited to metals, metal alloys, highly doped polysilicon and polycides (highly doped polysilicon/metal silicide stacks). For the second preferred embodiment of the present invention, the patterned first conductor layers 42a, 42b and 42c are each preferably formed of an aluminum containing conductor material, above and/or beneath which is formed an optional barrier material layer, as is conventional in the art of integrated circuit microelectronics fabrication. Other materials may, however, be employed when forming the series of patterned first conductor layers 42a, 42b and 42c. Preferably, each patterned conductor layer within the series of patterned first conductor layers 42a, 42b and 42c is preferably formed to, and separated by, dimensions analogous or equivalent to the dimensions employed when forming and separating the series of patterned microelectronics layers 12a, 12b and 12c within the first preferred embodiment of the present invention as illustrated within the schematic cross-sectional diagram of FIG. 1.

Finally, there is shown in FIG. 4 a conformal silicon oxide inter-metal dielectric (IMD) layer 44 formed upon the patterned first conductor layers 42a, 42b and 42c, and portions of the planarized pre-metal dielectric (PMD) layer 40 exposed adjoining the series of patterned first conductor layers 42a, 42b and 42c. Within the second preferred embodiment of the present invention, the conformal silicon oxide inter-metal dielectric (IMD) layer 44 is preferably formed employing methods, materials and dimensions analogous or equivalent to the methods, materials and dimensions employed when forming the conformal silicon oxide dielectric layer 14 as employed within the first preferred embodiment of the present invention and illustrated within the schematic cross-sectional diagram of FIG. 1.

Referring now to FIG. 5, there is shown a schematic cross-sectional diagram illustrating the results of further processing of the integrated circuit microelectronics fabrication whose schematic cross-sectional diagram is illustrated in FIG. 4. Shown in FIG. 5 is a schematic cross-sectional diagram of an integrated circuit microelectronics fabrication otherwise equivalent to the integrated circuit microelectronics fabrication whose schematic cross-sectional diagram is illustrated in FIG. 4, but wherein the conformal silicon oxide inter-metal dielectric (IMD) layer 44 has been treated with an oxygen containing plasma 46 to form an oxygen containing plasma treated conformal silicon oxide inter-metal dielectric (IMD) layer 44'. Within the second preferred embodiment of the present invention, the oxygen containing plasma 46 is preferably formed employing methods and materials analogous or equivalent to the methods and materials employed when forming the oxygen containing plasma 16 within the first preferred embodiment of the present invention as illustrated within the schematic cross-sectional diagram of FIG. 2. Thus, the oxygen containing plasma treated conformal silicon oxide inter-metal dielectric (IMD) layer 44' as illustrated within the schematic cross-sectional diagram of FIG. 5 is formed with analogous or equivalent properties in comparison with the oxygen containing plasma treated silicon oxide dielectric layer 14' as employed within the first preferred embodiment of the present invention and illustrated within the schematic cross-sectional diagram of FIG. 2.

Referring now to FIG. 6, there is shown a schematic cross-sectional diagram illustrating the results of further processing of the integrated circuit microelectronics fabrication whose schematic cross-sectional diagram is illustrated in FIG. 5. Shown in FIG. 6 is a schematic cross-sectional diagram of an integrated circuit microelectronics fabrication otherwise equivalent to the integrated circuit microelectronics fabrication whose schematic cross-sectional diagram is illustrated in FIG. 5, but wherein there is formed upon the oxygen containing plasma treated conformal silicon oxide inter-metal dielectric (IMD) layer 44' a second silicon oxide inter-metal dielectric (IMD) layer 48, where the second silicon oxide inter-metal dielectric (IMD) layer 48 defines a pair of voids 50a and 50b formed interposed between the patterned first conductor layers 42a, 42b and 42c.

Within the second preferred embodiment of the present invention, the second silicon oxide inter-metal dielectric (IMD) layer 48 is preferably formed employing methods, materials and dimensions analogous or equivalent to the methods, materials and dimensions employed when forming the second silicon oxide dielectric layer 18 within the first preferred embodiment of the present invention as illustrated within the schematic cross-sectional diagram of FIG. 3. Thus, the pair of voids defined by the second silicon oxide inter-metal dielectric (IMD) layer 48 as illustrated within the schematic cross-sectional diagram of FIG. 6 is formed for reasons analogous or equivalent to the reasons for which are formed the pair of voids 20a and 20b defined at least in part by the second silicon oxide dielectric layer 18 as illustrated within the schematic cross-sectional diagram of FIG. 3.

Upon forming the integrated circuit microelectronics fabrication whose schematic cross-sectional diagram is illustrated in FIG. 6, there is formed an integrated circuit microelectronics fabrication having formed therein a patterned conductor layer having interposed between its patterns a series of voids which provide a low dielectric constant dielectric material adjacent and separating the patterned conductor layers. The integrated circuit microelectronics fabrication so formed is typically capable of enhanced integrated circuit microelectronics fabrication speed, while exhibiting attenuated integrated circuit microelectronics fabrication parasitic capacitance and attenuated integrated circuit microelectronics fabrication cross-talk.

As is understood by a person skilled in the art, the second silicon oxide inter-metal dielectric (IMD) layer 48 as illustrated within the integrated circuit microelectronics fabrication whose schematic cross-sectional diagram is illustrated in FIG. 6 may be planarized, typically employing chemical mechanical polish (CMP) planarizing methods as are conventional in the art of integrated circuit microelectronics fabrication, to provide a planarized second silicon oxide inter-metal dielectric (IMD) layer upon which may be formed additional upper level patterned conductor layers and inter-metal dielectric (IMD) layers within the integrated circuit microelectronics fabrication whose schematic cross-sectional diagram is illustrated in FIG. 6, in accord with the method of the present invention. Such chemical mechanical polish (CMP) planarizing methods will typically not disturb voids, such as the pair of voids 50a and 50b formed interposed between the series of patterned first conductor layers 42a, 42b and 42c as illustrated within the schematic cross-sectional diagram of FIG. 6. Thus, the low dielectric constant dielectric character provided by the second silicon oxide dielectric layer 48 employed within the second preferred embodiment of the present invention or, by analogy, the second silicon oxide dielectric layer 18 within the first preferred embodiment of the present invention, is preserved even when planarized employing methods as are conventional in the art of microelectronics fabrication.

EXAMPLES

There was obtained four series of semiconductor substrates and formed thereupon equivalent microelectronics fabrication structures generally in accord with the microelectronics fabrication structure whose schematic cross-sectional diagram is illustrated in FIG. 1. The microelectronics fabrication structures employed patterned aluminum containing conductor layers of thickness about 5500 angstroms, linewidth about 0.32 microns and pitch spacing W1 about 0.32 microns. Formed conformally upon the patterned conductor layers were conformal silicon oxide layers formed employing a plasma enhanced chemical vapor deposition (PECVD) method employing silane as a silicon source material. The conformal silicon oxide dielectric layers were formed to a thickness of about 500 angstroms. The conformal silicon oxide layers were then treated with an oxygen containing plasma for any of several time intervals, as listed within Table I, to form a series of oxygen containing plasma treated conformal silicon oxide dielectric layers. Finally, there was formed upon each oxygen containing plasma treated conformal silicon oxide layer a second silicon oxide layer formed employing an ozone assisted thermal chemical vapor deposition (CVD) method employing tetraethylorthosilicate (TEOS) as a silicon source material. Process parameters employed for forming the conformal silicon oxide dielectric layers, the oxygen containing treatment plasmas and the second silicon oxide dielectric layers were in accord with corresponding process parameters disclosed within the preferred embodiments of the present invention.

There was then measured for equivalent lengths of the patterned conductor layers the capacitances between adjoining metal conductor patterns within the series of patterned conductor layers. Such measurements were undertaken employing methods as are conventional in the art of microelectronics fabrication. The results of the measurements are reported within Table I as a function of oxygen containing plasma treatment times for the conformal silicon oxide dielectric layers.

TABLE I

| O2 Plasma Trtmt | Capacitance |
| --- | --- |
| 0 sec | 7.02 pf |
| 30 | 6.55 |
| 60 | 6.78 |
| 120 | 6.44 |

From review of the data within Table I, there is observed a capacitance decrease with increasing oxygen containing plasma treatment time of a conformal silicon oxide dielectric layer, formed employing silane as a silicon source material, upon a patterned conductor layer prior to forming upon the conformal silicon oxide dielectric layer a second silicon oxide dielectric layer formed employing an ozone assisted thermal chemical vapor deposition (CVD) method employing tetraethylorthosilicate (TEOS) as a silicon source material. Thus, it is assumed, in accord with the preferred embodiments of the present invention, that there is formed interposed between the patterns within the patterned conductor layer a series of voids.

As is understood by a person skilled in the art, the preferred embodiments of the present invention are illustrative of the present invention rather than limiting of the present invention. Revisions and modifications may be made to methods, materials, structures and dimensions through which are formed microelectronics fabrications in accord with the first preferred embodiment of the present invention and integrated circuit microelectronics fabrications in accord with the second preferred embodiment of the present invention while still providing microelectronics fabrications, including but not limited to integrated circuit microelectronics fabrications, in accord with the methods of the present invention, as defined by the appended claims.

What is claimed is:

1. A method for forming a dielectric layer within a microelectronics fabrication comprising:

providing a microelectronics substrate layer employed within a microelectronics fabrication;

forming upon the microelectronics substrate layer a patterned microelectronics layer;

forming conformally over the patterned microelectronics layer a conformal silicon oxide dielectric layer formed employing a plasma enhanced chemical vapor deposition (PECVD) method employing silane as a silicon source material, the conformal silicon oxide dielectric layer comprising:

a first region of the conformal silicon oxide dielectric layer formed over the upper surfaces of the patterned microelectronics layer;

a second region of the conformal silicon oxide dielectric layer formed interposed between a series of patterns which comprises the patterned microelectronics layer and parallel with a series of sidewalls of the series of patterns which comprises the patterned microelectronics layer; and a third region of the conformal silicon oxide dielectric layer formed interposed between the series of patterns which comprises the patterned microelectronics layer but not parallel with the series of sidewalls of the series of patterns which comprises the patterned microelectronics layer;

treating with an oxygen containing plasma the conformal silicon oxide dielectric layer to form an oxygen containing plasma treated conformal silicon oxide dielectric layer, the oxygen containing plasma treated conformal silicon oxide dielectric layer having an enhanced rate of formation of a second silicon oxide dielectric layer upon the first region of the oxygen containing plasma treated conformal silicon oxide dielectric layer with respect to at least the second region of the oxygen containing plasma treated conformal silicon oxide dielectric layer, the second silicon oxide dielectric layer being formed employing an ozone assisted thermal chemical vapor deposition (CVD) method employing tetraethylorthosilicate (TEOS) as a silicon source material; and forming upon the oxygen containing plasma treated conformal silicon oxide dielectric layer the second silicon oxide dielectric layer, where the second silicon oxide dielectric layer defines at least in part a series of voids formed interposed between the series of patterns which comprises the patterned microelectronics layer.

2. The method of claim 1 wherein the microelectronics fabrication is selected from the group consisting of integrated circuit microelectronics fabrications, solar cell microelectronics fabrications, ceramic substrate microelectronics fabrications and flat panel display microelectronics fabrications.

3. The method of claim 1 wherein the microelectronics substrate layer is selected from the group consisting of microelectronics conductor substrate layers, microelectronics semiconductor substrate layers and microelectronics dielectric substrate layers.

4. The method of claim 1 wherein the patterned microelectronics layer is selected from the group consisting of patterned microelectronics conductor layers, patterned microelectronics semiconductor layers and patterned microelectronics dielectric layers.

5. The method of claim 1 wherein the oxygen containing plasma employs an oxygen containing plasma gas composition comprising an oxygen containing gas selected from the group consisting of oxygen, ozone, nitrous oxide, nitric oxide.

6. A method for forming a dielectric layer within an integrated circuit microelectronics fabrication comprising:

providing a semiconductor substrate;

forming over the semiconductor substrate a dielectric substrate layer;

forming upon the dielectric substrate layer a patterned conductor layer;

forming conformally over the patterned conductor layer a conformal silicon oxide dielectric layer formed employing a plasma enhanced chemical vapor deposition (PECVD) method employing silane as a silicon source material, the conformal silicon oxide dielectric layer comprising:
- a first region of the conformal silicon oxide dielectric layer formed over the upper surfaces of the patterned conductor layer;
- a second region of the conformal silicon oxide dielectric layer formed interposed between a series of patterns which comprises the patterned conductor layer and parallel with a series of sidewalls of the series of patterns which comprises the patterned conductor layer; and
- a third region of the conformal silicon oxide dielectric layer formed interposed between the series of patterns which comprises the patterned conductor layer but not parallel with the series of sidewalls of the series of patterns which comprises the patterned conductor layer;

treating with an oxygen containing plasma the conformal silicon oxide dielectric layer to form an oxygen containing plasma treated conformal silicon oxide dielectric layer, the oxygen containing plasma treated silicon oxide dielectric layer having an enhanced rate of formation of a second silicon oxide dielectric layer upon the first region of the oxygen containing plasma treated conformal silicon oxide dielectric layer with respect to at least the second region of the oxygen containing plasma treated conformal silicon oxide dielectric layer, the second silicon oxide dielectric layer being formed employing an ozone assisted thermal chemical vapor deposition (CVD) method employing tetraethylorthosilicate (TEOS) as a silicon source material; and forming upon the oxygen containing plasma treated conformal silicon oxide dielectric layer the second silicon oxide dielectric layer, where the second silicon oxide dielectric layer defines at least in part a series of voids formed interposed between the series of patterns which comprises the patterned conductor layer.

7. The method of claim 6 wherein the oxygen containing plasma employs an oxygen containing plasma gas composition comprising an oxygen containing gas selected from the group consisting of oxygen, ozone, nitrous oxide, nitric oxide.

\* \* \* \* \*